United States Patent
Kajita et al.

(10) Patent No.: US 6,813,323 B2
(45) Date of Patent: Nov. 2, 2004

(54) DECODING METHOD AND COMMUNICATION TERMINAL APPARATUS

(75) Inventors: Kuniyuki Kajita, Yokohama (JP); Maho Takita, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 196 days.

(21) Appl. No.: 10/182,270

(22) PCT Filed: Nov. 22, 2001

(86) PCT No.: PCT/JP01/10207

§ 371 (c)(1),
(2), (4) Date: Jul. 25, 2002

(87) PCT Pub. No.: WO02/45326

PCT Pub. Date: Jun. 6, 2002

(65) Prior Publication Data

US 2003/0012309 A1 Jan. 16, 2003

(30) Foreign Application Priority Data

Nov. 29, 2000 (JP) ........................... 2000-362431

(51) Int. Cl.[7] ............................. H03D 1/00; H04L 27/06
(52) U.S. Cl. ..................... 375/341; 375/316; 375/340; 375/365
(58) Field of Search .................. 375/130–377; 370/320, 335, 328, 389; 455/418, 552; 714/746, 780

(56) References Cited

U.S. PATENT DOCUMENTS 5,610,910 A    3/1997    Focsaneanu et al.
5,638,376 A    6/1997    Miki et al.
5,677,930 A    10/1997    Bottomley (List continued on next page.)

FOREIGN PATENT DOCUMENTS

| EP | 1104216 A1 | 5/2001 |
|---|---|---|
| JP | 07170210 | 7/1995 |
| JP | 08051656 | 2/1996 |
| JP | 2001 196939 | 7/2001 |
| JP | 2001 217895 | 8/2001 |
| JP | 2001 513598 | 9/2001 |

OTHER PUBLICATIONS

International Search Report dated Feb. 26, 2002.
3GPP TS 25.211 v3.4.0, Sep. 2000, 3rd Generation Partnership Project; Technical Specification Group Radio Access Network; Physical channels and mapping of transport channels onto physical channels (FDD), Release 1999, pp. 1–43, 61 and 62.
3GPP TS 25.212 v3.4.0, Sep. 2000, 3rd Generation Partnership Project; Technical Specification Group Radio Access Network; Multiplexing and channel coding (FDD), Release 1999, pp. 1–60.

Primary Examiner—Stephen Chin
Assistant Examiner—Curtis Odom
(74) Attorney, Agent, or Firm—Stevens, Davis, Miller & Mosher, LLP

(57) ABSTRACT

Candidate limiting section 104 outputs to correlation value calculating section 105 only the TFCI coding sequences corresponding to TFCI numbers that are actually used based on TFCI numbers that are included in the group of TFCI numbers notified from a layer which is upper than the physical layer, correlation value calculating section 105 calculates the correlation values between the coding sequences outputted from candidate limiting section 104 and the received TFCI and stores the results in correlation value memory 106, maximum value detecting section 107 notifies error correction decoding section 108 of the TFCI number corresponding to the maximum correlation value among the correlation values stored in correlation value memory 106, and error correction decoding section 108 performs an error correction decoding on the data stored in data memory 103 according to the transmission format specified based on the notified TFCI number.

6 Claims, 5 Drawing Sheets

U.S. PATENT DOCUMENTS

| | | |
|---|---|---|
| 6,064,689 A | 5/2000 | Vollmer et al. |
| 6,278,697 B1 | 8/2001 | Brody et al. |
| 6,341,125 B1 * | 1/2002 | Hong et al. .................. 370/335 |
| 6,707,859 B1 * | 3/2004 | Kinnunen et al. .......... 375/316 |
| 2001/0004380 A1 | 6/2001 | Mannermaa |
| 2001/0004381 A1 | 6/2001 | Kontola |
| 2001/0008542 A1 | 7/2001 | Wiebke et al. |
| 2001/0020287 A1 | 9/2001 | Yano et al. |
| 2001/0021229 A1 | 9/2001 | Belaiche |
| 2001/0021236 A1 | 9/2001 | Song |
| 2001/0022782 A1 | 9/2001 | Steudle |
| 2001/0026543 A1 | 10/2001 | Hwang et al. |
| 2001/0036823 A1 | 11/2001 | Van Lieshout et al. |
| 2001/0040916 A1 | 11/2001 | Sato |

* cited by examiner

DECODING METHOD AND COMMUNICATION TERMINAL APPARATUS

TECHNICAL FIELD

The present invention relates to a decoding method and a communication terminal apparatus, and more particularly, to a decoding method and a communication terminal apparatus whereby data is decoded in accordance with a Transport Format Combination Indicator (TFCI) transmitted from a base station apparatus and a TFCI determination result.

BACKGROUND ART

In third generation mobile communication system using a CDMA technology, the execution of variable rate transmission by which the data rate is changed for every TTI (Transmission Time Interval) unit is proposed. The determination of data rate in the receiving side by a TFCI (Transport Format Combination Indicator) which includes the transmission format information is also proposed. Moreover, TTI is a data transmission length specified for every channel, and such a length is either 1, 2, 4 or 8 frame(s).

Moreover, the transmission format of data (namely, block size of data and the number of blocks of data) are specified by a TFCI number. In other words, the data rate is specified by the TFCI number. According to the specification of the third generation mobile communication system specified by 3GPP, the TFCI is shown by one number from among 1024 numbers from the 0th through 1023rd, converted into a codeword corresponding to each number (hereinafter, a codeword corresponding to each number is referred to as "TFCI coding sequence") and then transmitted.

In the receiving side which receives the TFCI, the correlation values between each of the 1024 TFCI coding sequences which are specified beforehand and the actually received TFCI are calculated by the decoding apparatus, and the number corresponding to the correlation value which is maximum among the 1024 calculated correlation values is determined as the received TFCI number. Then, decoding apparatus performs decoding of data based on transmission format specified by the determined TFCI number.

Among the 1024 TFCI numbers, normally about 10 numbers or at most 100 numbers are actually used in mobile communication system. Consequently, because the correlation values corresponding to all 1024 TFCI coding sequences are calculated in the aforementioned conventional decoding apparatus even it is not important to calculate the correlation values corresponding to all 1024 TFCI coding sequences, there is a problem that the processing amount and power consumption which are required to determine the TFCI number become large. Thus, when the aforementioned conventional decoding apparatus is built in a communication terminal which is driven by a battery, there is a problem that the using time of a communication terminal becomes short.

Moreover, when an error occurrs with TFCI due to the influence of noise and such in the propagation path, a case might result in the decoding apparatus where the correlation value calculated using a TFCI coding sequence having a close inter-code distance to a transmitted TFCI coding sequence becomes maximum. In the case when the TFCI number corresponding to TFCI coding sequence with a near inter-code distance is the TFCI number which is not actually used, there is a problem that this TFCI number which is not actually used is erroneously determined as the received TFCI number.

Because the data will be decoded by an erroneous transmission format when the TFCI number is erroneously determined, all the data of TTI in respect to which the transmission format is erroneously determined might be erroneously decoded, and hence, the error rate characteristics of the received data will be remarkably deteriorated.

DISCLOSURE OF INVENTION

It is an object of the present invention to provide a decoding apparatus and a decoding method that are capable to improve the TFCI determining precision while reducing the amount of processing and power consumption which are required to determine the TFCI.

In order to achieve such an object, in the present invention, TFCI is determined using only those actually used TFCI numbers as candidates from among a plurality of TFCI numbers. Therefore, it is possible to improve the TFCI determining precision while reducing the processing amount and power consumption that are required to determine the TFCI.

BEST MODE FOR CARRYING OUT THE INVENTION

Embodiments of the present invention will be specifically described hereinafter with reference to the accompanying drawings.

(Embodiment 1)

Figure 1:
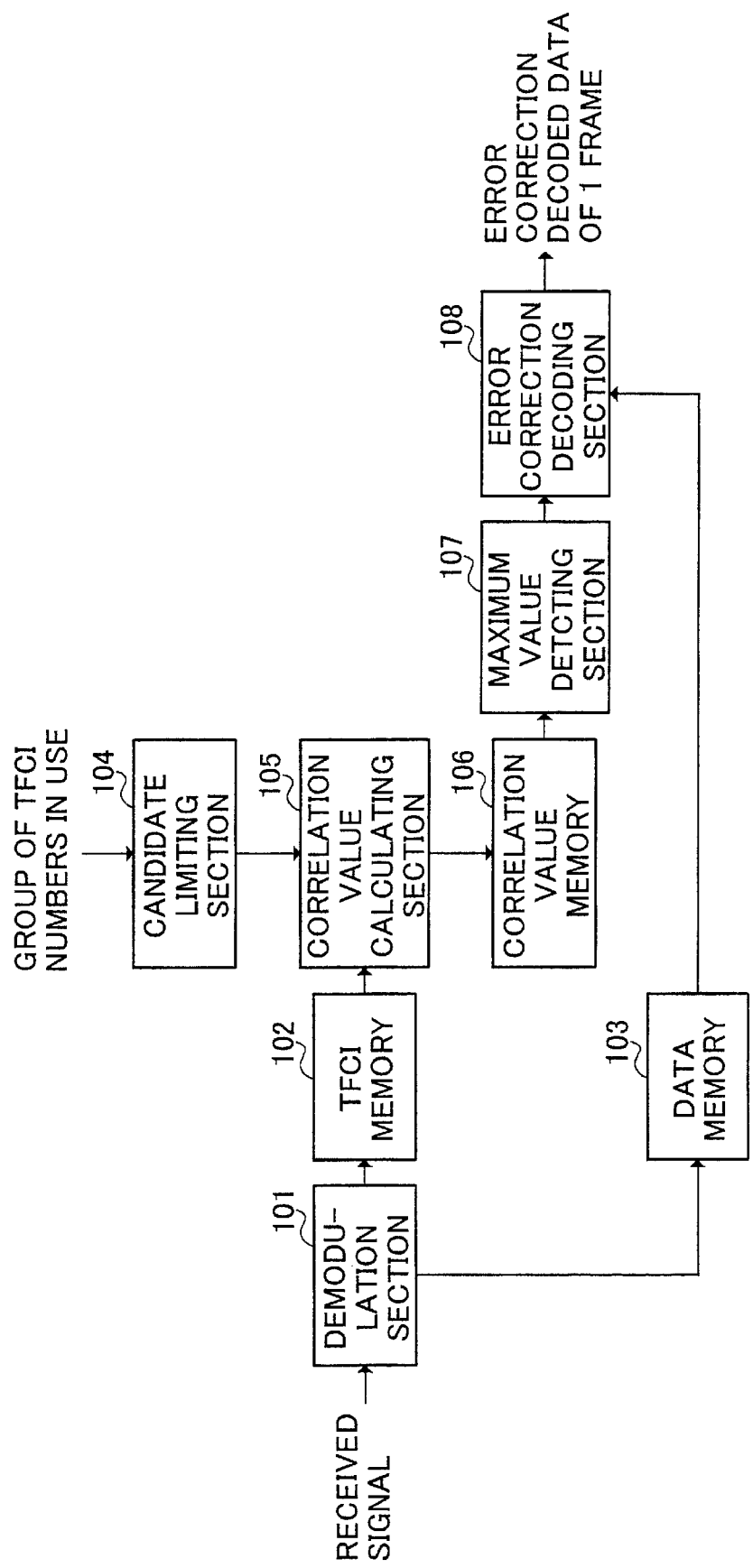
FIG. 1 is a block diagram showing a configuration of a decoding apparatus according to Embodiment 1 of the present invention.

FIG. 1 is a block diagram showing a configuration of a decoding apparatus according to Embodiment 1 of the present invention. The decoding apparatus shown in FIG. 1 is built in, for instance, a communication terminal apparatus such as, a cellular phone and such used in a mobile communication system. For example, such a communication terminal apparatus carries out radio communication based on CDMA technology. Moreover, in the following description it is assumed that the TFCI transmitted from a communication partner is shown by one TFCI number from among the 1024 TFCI numbers from the 0th through 1023rd using 10 bits and transmitted after being converted into TFCI coding sequence of 32 bits.

In the decoding apparatus shown in FIG. 1, demodulation section 101 demodulates the received signal including TFCI, and outputs the TFCI portion in the demodulated received signal to TFCI memory 102 while outputting the data portion to data memory 103. In addition, each bit of TFCI is distributed into a predetermined position of each slot of the received signal and it is difficult to carry out TFCI determination until TFCI of one frame is received in the decoding apparatus. Accordingly, TFCI memory 102 accumulates TFCI of one frame. Moreover, data memory 103 accumulates data of one frame.

Since the group of TFCI numbers that may actually be used (hereinafter, the group of TFCI numbers that may actually be used is referred to as "the group of TFCI numbers in use") for every communication channel is specified by a layer which is upper than the physical layer (hereinafter, simply it is referred to as "upper layer") in the mobile communication system, candidate limiting section 104 is notified from upper layer with the group of TFCI numbers in use.

Candidate limiting section 104 has a table that shows the correspondence relation between the TFCI number and TFCI coding sequence. Further, candidate limiting section 104 outputs to correlation value calculating section 105 only the TFCI coding sequences corresponding to TFCI numbers that are actually used among the 1024 TFCI numbers from the 0th through 1023rd referring to the table based on each TFCI number that is included in the group of TFCI numbers notified from upper layer. That is to say, candidate limiting section 104 limits the candidates for TFCI to an actually used N TFCIs among the 1024 TFCIs.

Correlation value calculating section 105, by way of calculating the correlation values between the coding sequences outputted from candidate limiting section 104 and the received TFCI, calculates correlation values using only those actually used TFCI numbers as candidates from among the 1024 TFCI numbers from the 0th through 1023rd. That is, correlation value calculating section 105 calculates correlation values between each of TFCI coding sequences corresponding to the actually used TFCI numbers and the received TFCI. Correlation value calculating section 105 outputs each of the calculated correlation values along with the TFCI number to correlation value memory 106. Moreover, it is possible to perform a high speed calculation of the correlation value by using, for instance, a high speed Hadamard transform for correlation value calculation.

Correlation value memory 106 stores correlation values outputted from correlation value calculating section 105 in correspondence with the TFCI numbers.

Maximum value detecting section 107 detects the maximum correlation value among correlation values stored in correlation value memory 106. Then, maximum value detecting section 107 notifies error correction decoding section 108 of the TFCI number corresponding to the maximum correlation value.

Error correction decoding section 108 specifies the transmission format of the data accumulated in data memory 103 based on TFCI number notified from maximum value detecting section 107, and performs error correction decoding on the data accumulated in data memory 103 based on the specified transmission format. In addition, the error correction decoding is performed based on, for instance, Viterbi algorithm.

Operation of the decoding apparatus which has the aforementioned configuration will be explained below.

Only the TFCI coding sequences corresponding to TFCI numbers included in the group of TFCI numbersin use notified by the upper layer is outputted to correlation value calculating section 105 from candidate limiting section 104.

Correlation values between the TFCI coding sequences outputted from candidate limiting section 104 and TFCI of one frame accumulated in TFCI memory 102 are calculated in correlation value calculating section 105. In other words, only the correlation values corresponding to the actually used N TFCI numbers among the 1024 TFCI numbers are calculated in correlation value calculating section 105.

For example, when the actually used TFCI numbers is limited to 30, each correlation value between the TFCI coding sequence corresponding to each number of those 30 and the TFCI of one frame accumulated in TFCI memory 102 is calculated. According to this example, since 30 correlation values are calculated in comparison with the 1024 correlation values having been conventionally calculated, it is possible to reduce remarkably the processing amount and power consumption required for the correlation value calculation processing which is one process of determining processes of TFCI.

The calculated N correlation values along with the corresponding TFCI numbers are outputted to correlation value memory 106. N correlation values and the corresponding TFCI numbers are stored in correlation value memory 106.

The maximum correlation value among the correlation values stored in correlation value memory 106 is detected in maximum value detecting section 107. Then, the TFCI number corresponding to the maximum correlation value is determined as a number of TFCI that is accumulated in TFCI memory 102 (i.e., the received TFCI). The determined TFCI number is notified to error correction decoding section 108.

As described above, when an error is occurred in the TFCI due to the influence of noise and such in the propagation path, there is a case in the aforementioned conventional decoding apparatus that the correlation value corresponding to the TFCI number which is not actually used becomes the maximum, and the number of the received TFCI is erroneously determined.

On the other hand, in the decoding apparatus according to the present embodiment, the correlation values subject to determination in maximum value detecting section 107 are limited to the N correlation values corresponding to the actually used TFCI numbers. That is to say, it is possible to prevent the correlation value corresponding to the TFCI number which is not actually used to be detected as the maximum in maximum value detecting section 107.

Thus, in the decoding apparatus according to the present embodiment, the probability that TFCI is erroneously determined is minimized and the determination accuracy of TFCI is improved comparing to the aforementioned conventional decoding apparatus. Hence, it is possible to prevent the deterioration of error rate characteristics of the received data.

In error correction decoding section 108, the transmission format of the data accumulated in data memory 103 is specified based on TFCI number notified from maximum value detecting section 107. Then, the data accumulated in data memory 103 is subjected to error correction decoding based on the specified transmission format. Accordingly, a data of one frame subjected to error correction decoding processing is obtained.

Therefore, according to the present embodiment, it is possible to improve the TFCI determination precision while reducing the amount of processing and power consumption required to determine the TFCI by performing TFCI determination by using only those actually used TFCI numbers as candidates from among a plurality of TFCI numbers.

(Embodiment 2)

Figure 2:
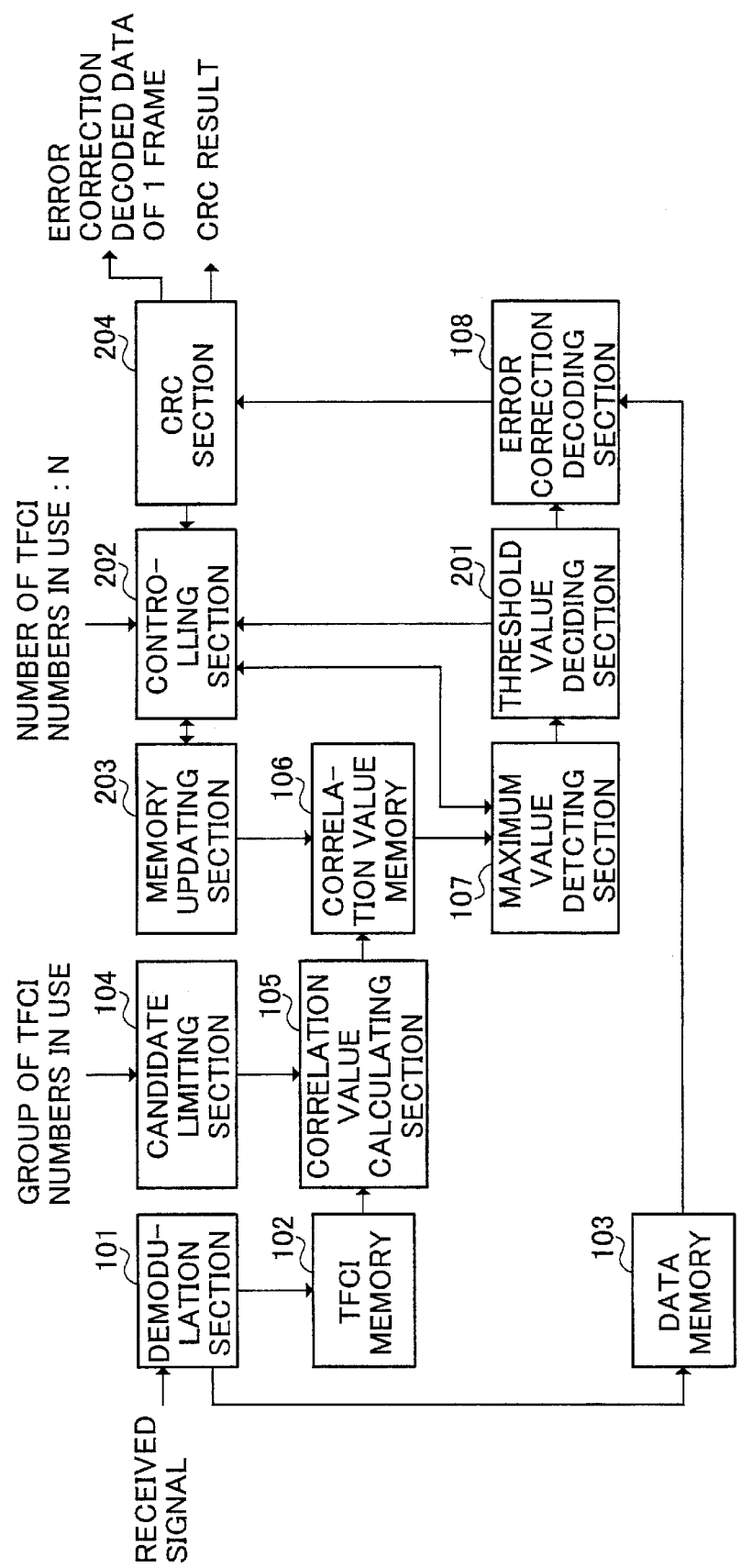
FIG. 2 is a block diagram showing a configuration of a decoding apparatus according to Embodiment 2 of the present invention.

FIG. 2 is a block diagram showing a configuration of a decoding apparatus according to Embodiment 2 of the present invention. As shown in this figure, in addition to the decoding apparatus shown in FIG. 1, the decoding apparatus according to the present embodiment is further provided with threshold value deciding section 201, controlling section 202, memory updating section 203 and CRC section 204. In FIG. 2, however, the corresponding similar sections shown in FIG. 1 are assigned the same reference numerals and explanations thereof are omitted.

In the decoding apparatus shown in FIG. 2, threshold value deciding section 201 decides whether the maximum correlation value detected by maximum value detecting section 107 is above a predetermined threshold. Threshold value deciding section 201 notifies error correction decoding section 108 of TFCI number corresponding to the correlation value when such a correlation value is above a predetermined threshold, and when the correlation value is below the predetermined threshold, it notifies controlling section 202 of such a result along with TFCI number. Controlling section 202 controls the operation of maximum value detecting section 107 and memory updating section 203 based on a instruction from threshold value deciding section 201 and CRC section 204.

Memory updating section 203 updates a correlation value that is determined to be below the predetermined threshold value in threshold value determining section 201 and a correlation value that corresponds to a TFCI number that is used upon error correction decoding of the data with which an error is detected in CRC section 204 into a value that cannot be detected as a maximum value (for instance, 0 value) from the correlation values stored in correlation value memory 106 based on a instruction from controlling section 202. In addition, the explanation of how the correlation value is updated as "0" by memory updating section 203 will be given below.

CRC section 204 uses an error detecting code such as CRC which is included in the data subjected to error correction decoding (hereinafter, simply referred to as "decoded data") to perform an error detection processing on the decoded data. Then, CRC section 204 outputs only the decoded data of which an error is not detected along with CRC result. Further, when an error is detected in the decoded data, CRC section 204 notifies controlling section 202 of an error-detected command along with TFCI number while discarding the decoded data.

Figure 3:
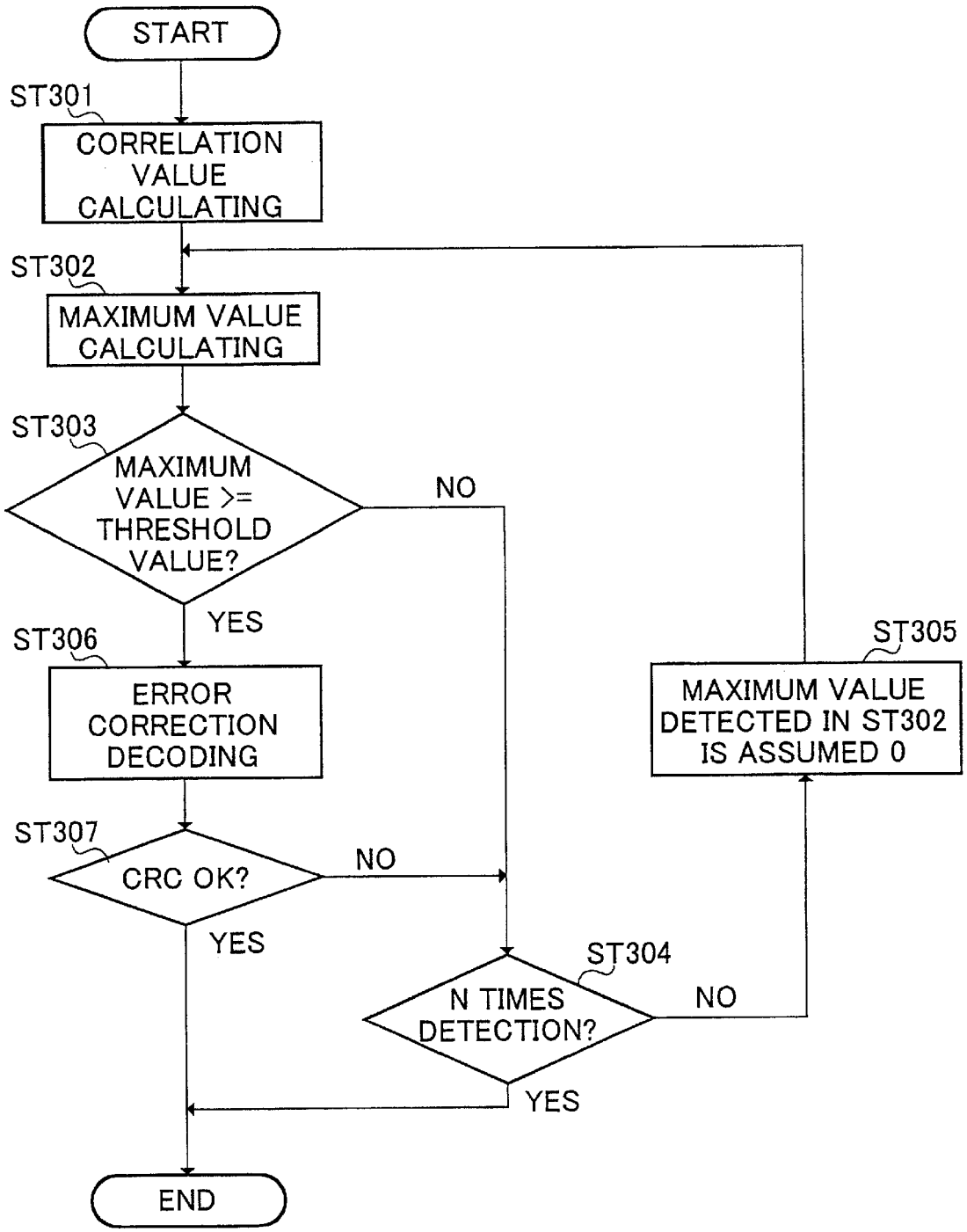
FIG. 3 is a flowchart showing an operation of a decoding apparatus according to Embodiment 2 of the present invention.

Operation of the decoding apparatus which has the aforementioned configuration will be explained below. FIG. 3 is a flowchart showing an operation of a decoding apparatus according to Embodiment 2 of the present invention.

First, in step (hereinafter, it is referred to as "ST") 301, similar to the aforementioned Embodiment 1, a correlation value is calculated from the candidates of actually used TFCI numbers in correlation value calculating section 105, and the calculated correlation value along with the TFCI number is outputted to correlation value memory 106.

Next, in ST302, the maximum correlation value among correlation values stored in correlation value memory 106 is detected by maximum value detecting section 107. Then, maximum value detecting section 107 outputs the maximum correlation value along with its corresponding TFCI number to threshold value deciding section 201.

Moreover, maximum value detecting section 107 outputs a signal that indicates the execution of maximum value detection to controlling section 202. Controlling section 202 is provided with a counter for counting the number of times of maximum value detection, and controlling section 202 increments the counter by 1 whenever the signal which indicates the execution of maximum value detection is outputted from maximum value detecting section 107. Further, it is assumed that the initial value of the counter is "1".

Then, in ST303, threshold value deciding section 201 decides whether the maximum value detected by maximum value detecting section 107 is above the predetermined threshold. When that maximum value is below the predetermined threshold, threshold deciding section 201 notifies controlling section 202 of such a result along with the TFCI number. Further, when the maximum value is below the predetermined threshold in ST303 then proceed to ST304.

Next, in ST304, the controlling section 202 decides whether the number of times of the maximum value detection has reached the number N of the actually used TFCI numbers (hereinafter, it is referred to as "number of TFCI numbers in use") with reference to the counter value. In the mobile communication system as described above, because the group of TFCI numbers in use is specified for every communication channel by an upper layer, controlling section 202 is notified of the number of TFCI numbers in use:N from the upper layer.

When the number of times of the maximum value detection does not reach the number of TFCI numbers in use:N, in ST305, controlling section 202 notifies memory updating section 203 of the TFCI number notified from threshold value deciding section 201 and, furthermore, instructs memory updating section 203 to update the correlation value corresponding to the TFCI number notified from threshold value deciding section 201 to "0".

Following the instruction, the correlation value that has been decided to be below the predetermined threshold in threshold value deciding section 201 among correlation values stored in correlation value memory 106 is updated as "0" by memory updating section 203. After updating processing, memory updating section 203 outputs a signal that indicates the completion of updating processing to controlling section 202. Based on such a signal, controlling section 202 instructs maximum value detecting section 107 to re-execute maximum value detection processing in ST302. Since the maximum value last detected in ST302 is already updated as "0", with the processing of ST 302 of this time, a correlation value that is next large to the maximum value last detected in ST 302 is detected as the maximum value. Moreover, when the number of times of maximum value detection reaches the number of TFCI numbers in use:N in ST304, controlling section 202 stops the maximum value detection operation until next decoding timing while resetting the counter to "1".

On the other hand, when the maximum value of the correlation value detected by maximum value detecting section 107 is above the predetermined threshold in ST303, the TFCI number corresponding to such a correlation value is notified to error correction decoding section 108 by threshold value deciding section 201.

Then, error correction decoding section 108 specifies the transmission format of the data accumulated in data memory 103 based on TFCI number notified from threshold value deciding section 201 in ST306. After this, the data accumulated in data memory 103 is subjected to error correction decoding based on the specified transmission format. The decoded data is outputted to CRC section 204.

Next, CRC section 204 performs error detection on the decoded data in ST307. When an error was not detected, CRC section 204 outputs the decoded data along with the CRC result, thereby, the decoding processing is finished. In this case, CRC section 204, further, notifies the controlling section 202 of an error-undetected command. According to such a notification command, controlling section 202 stops the maximum value detection operation until the next decoding timing while resetting the counter to "1".

On the other hand, when an error was detected, CRC section 204 notifies controlling section 202 of an error-detected command along with TFCI number while discarding the decoded data. In this case, progressing to ST304.

In ST305 after the processing of ST304, controlling section 202 notifies memory updating section 203 of the TFCI number notified from CRC section 204 and, furthermore, instructs memory updating section 203 to update the correlation value corresponding to the TFCI number notified from CRC section 204 to "0". Following the instruction, memory updating section 203 updates the correlation value corresponding to the TFCI number used at the time of error correction decoding of the data with an error detected in CRC section 204 among correlation values stored in correlation value memory 106 to "0". After updating processing, memory updating section 203 outputs a signal that indicates the completion of updating processing to controlling section 202. Based on such a signal, controlling section 202 instructs maximum value detecting section 107 to re-execute maximum value detection processing in ST302.

Hereafter, the correlation values stored in correlation value memory 106 are detected by maximum value detecting section in order from larger ones, and until such detected correlation value becomes above a predetermined threshold and until no error is detected with the decoded data decoded based on the TFCI number that corresponds to the detected correlation value, above the aforementioned processing are repeated maximum of N times.

Therefore, according to the present embodiment, because only the TFCI number corresponding to the correlation value that becomes above a predetermined threshold value is determined as the received TFCI number, it is possible to improve the determination reliability of the TFCI.

Moreover, because the TFCI determination and data decoding are carried out repeatedly until an error is no longer detected in the decoded data that is decoded based on the TFCI number corresponding to the correlation value which becomes above the predetermined threshold, it is also possible to improve the decoding reliability of data.

(Embodiment 3)

Figure 4:
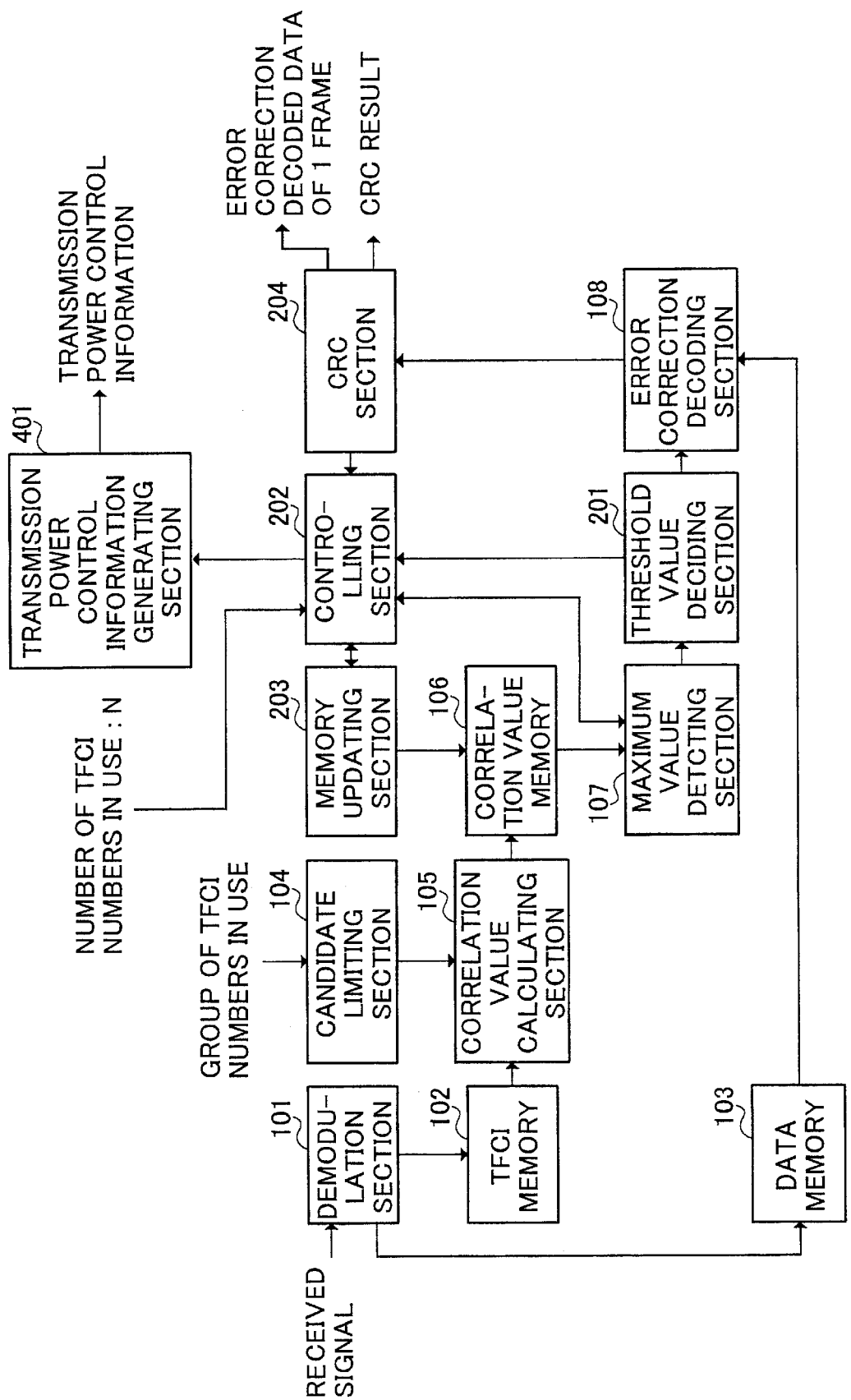
FIG. 4 is a block diagram showing a configuration of a decoding apparatus according to Embodiment 3 of the present invention.

FIG. 4 is a block diagram showing a configuration of a decoding apparatus according to Embodiment 3 of the present invention. As shown in this figure, the decoding apparatus according to the present embodiment is provided with transmission power control information generating section 401 in addition to the decoding apparatus shown in FIG. 2. Further, the corresponding similar sections shown in FIG. 2 are assigned the same reference numerals in FIG. 4 and explanations thereof are omitted.

In the decoding apparatus shown in FIG. 4, transmission power control information generating section 401 generates transmission power control information to instruct the communication partner to increase the signal transmission power based on a instruction from controlling section 202.

Figure 5:
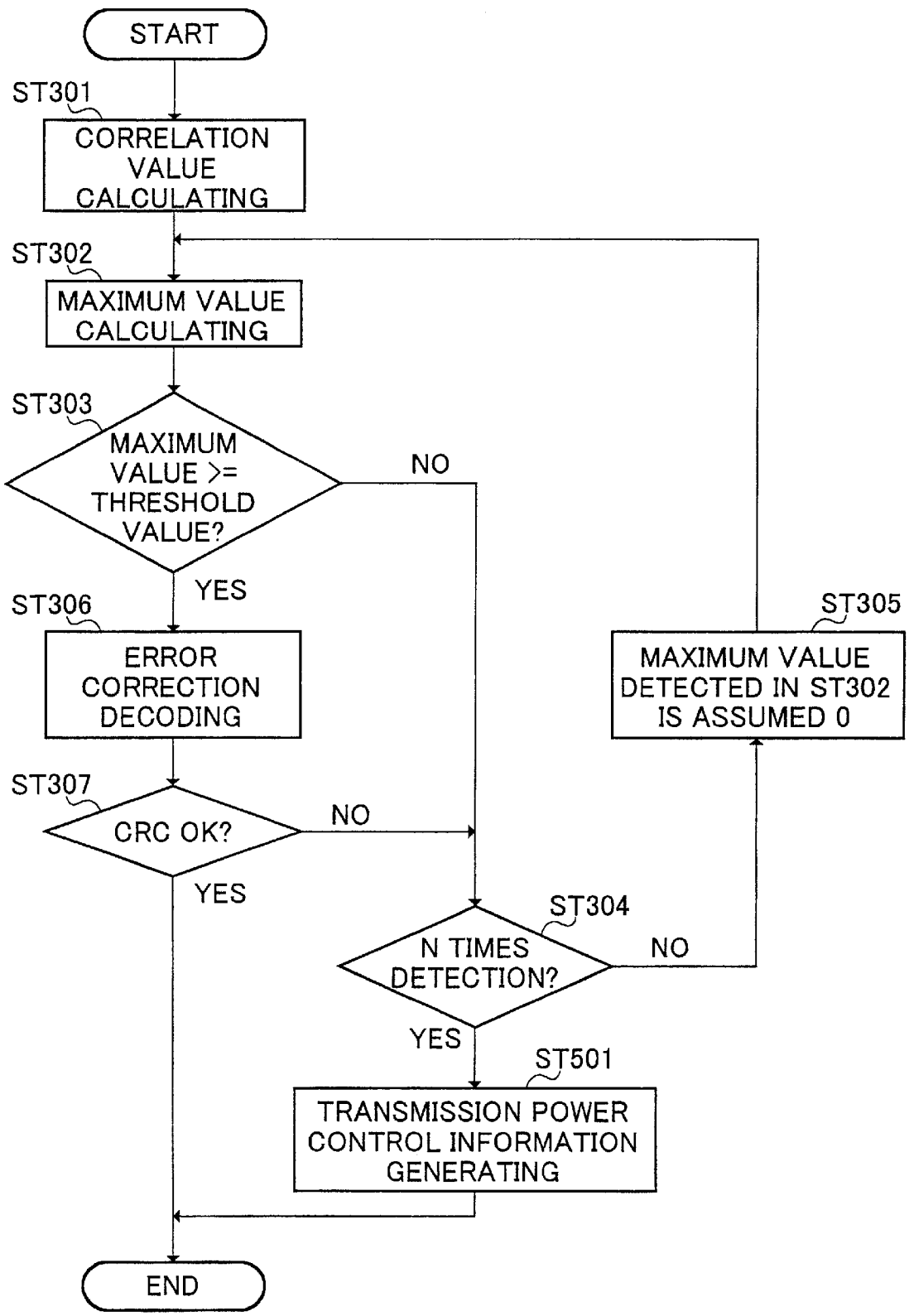
FIG. 5 is a flowchart showing an operation of a decoding apparatus according to Embodiment 3 of the present invention.

Operation of the decoding apparatus which has the aforementioned configuration will be explained below. FIG. 5 is a flowchart showing an operation of a decoding apparatus according to Embodiment 3 of the present invention. Moreover, the corresponding similar operational steps shown in FIG. 3 are assigned the same reference numerals in FIG. 5 and explanations thereof are omitted.

When in ST304 the counter provided in controlling section 202 reaches the number of TFCI numbers in use:N, in ST501, controlling section 202 instructs transmission power control information generating section 401 to generate transmission power control information to instruct the communication partner to increase signal transmission power. Transmission power control information generating section 401 generates transmission power control information such as TPC (Transmission Power Control) bit to instruct the communication partner to increase signal transmission power based on a instruction from controlling section 202, and outputs this transmission power control information to the transmission part inside a communication terminal apparatus. In this transmission part, the transmission power control information is mapped into a transmission signal and transmitted to the communication partner (base station). The communication partner increases the transmission power of the signal including TFCI based on the received transmission power control information.

That is, when the total of both, the number of correlation values which are below the predetermined threshold value and the number of the decoded data in which the error is detected, reaches the number of TFCI numbers in use:N, the decoding apparatus according to the present embodiment decides that the channel environments are inferior, and instructs the communication partner to increase the transmission power of the signal including TFCI.

According to the present embodiment, because the transmission power of the signal including the TFCI is increased in the communication partner side when the channel environments are inferior, it is possible to improve the receiving quality of TFCI. Thus, since it is possible to receive the TFCI with good receiving quality regardless to the channel environment, even when the channel environments are inferior, the TFCI can be determined correctly and it is possible also to prevent deterioration of the decoding characteristics of data.

In addition, the decoding apparatus according to the aforementioned Embodiments 1–3 can be built in a communication terminal apparatus or base station apparatus that carries out communication with this communication terminal apparatus employed in a radio communication system. In such a case, because the error rate characteristics are improved by improving the TFCI determination accuracy in both communication terminal apparatus and base station apparatus, it is possible to enhance and improve the data communication quality, speech quality, etc.

As described above and according to the present invention, while being able to improve the determination accuracy of TFCI, the processing amount and power consumption required for TFCI determination can be reduced.

The present application is based on the Japanese Patent Application No. 2000-362431 filed on Nov. 29, 2000, entire content of which is expressly incorporated by reference herein.

What is claimed is:

1. A decoding method for a communication terminal apparatus in a mobile communication system, said method comprising:

(a) receiving notification of transport format combination indicators (TFCIs) identified in a higher layer than a physical layer;

(b) limiting transport format combination indicator (TFCI) candidates, for received data, with respect to a plurality of TFCIs, to said TFCIs identified in accordance with said notification;

(c) determining a TFCI, from among the TFCI candidates limited in step (b), for said received data; and (d) obtaining decoded data by decoding said received data in accordance with the TFCI determined in step (c).

2. The decoding method according to claim 1, further comprising obtaining a plurality of correlation values between a received signal sequence and signal sequences that respectively correspond to the TFCI candidates limited in step (b), and wherein step (c) comprises determining the TFCI that corresponds to a maximum correlation value among said plurality of correlation values as said TFCI for said received data.

3. The decoding method according to claim 2, wherein wherein step (c) comprises determining the TFCI corresponding to the maximum correlation value above a predetermined threshold value as said TFCI for said received data.

4. The decoding method according to claim 2, further comprising instructing a base station apparatus to increase a transmission power when both a total of the number of the maximum correlation values below said predetermined threshold value and the number of decoded data that contain an error reach the number of said TFCI candidates.

5. The decoding method according to claim 1, further comprising step (e) including discarding the decoded data that contain an error, while steps (c) and (d) are repeated to determine said TFCI for said received data until the decoded data contain no error.

6. A communication terminal apparatus in a mobile communication system, said apparatus comprising:
   a receiver that receives notification of transport format combination indicators (TFCIs) identified in a higher layer than a physical layer;
   a limiter that limits transport format combination indicator (TFCI) candidates, for received data, with respect to a plurality of TFCIs, to said TFCIs identified in accordance with said notification;
   a determiner that determines a TFCI, from among the TFCI candidates limited by said limiter, for said received data; and
   a decoder that obtains decoded data by decoding said received data in accordance with the TFCI determined by said determiner.

* * * * *